United States Patent [19]

Manty et al.

[11] 4,433,005
[45] Feb. 21, 1984

[54] FATIGUE RESISTANT TATANIUM ALLOY ARTICLES

[75] Inventors: Brian A. Manty, Lake Park; Thomas A. Eckler, West Palm Beach, both of Fla.; Shiro Fujishiro, Yellow Springs, Ohio

[73] Assignee: United Technologies Corporation, Hartford, Conn.

[21] Appl. No.: 339,217

[22] Filed: Jan. 13, 1982

Related U.S. Application Data

[63] Continuation of Ser. No. 143,963, May 5, 1980, abandoned.

[51] Int. Cl.³ .............................................. B05D 3/06
[52] U.S. Cl. .................................. 427/38; 416/241 R; 428/938
[58] Field of Search .......................... 148/4, 13, 31.5; 428/938, 941; 427/38, 252, 253; 416/241 R

[56] References Cited

U.S. PATENT DOCUMENTS 3,900,636 8/1975 Curry et al. .......................... 427/38
4,137,370 1/1979 Fujishiro et al. ................... 428/660

FOREIGN PATENT DOCUMENTS 1483388 9/1969 Fed. Rep. of Germany .......... 148/4
2202015 7/1972 Fed. Rep. of Germany .......... 148/4
53-48103 5/1978 Japan .............................. 416/241 R
990174 4/1965 United Kingdom ................. 427/252

Primary Examiner—Michael L. Lewis
Attorney, Agent, or Firm—Charles E. Sohl

[57] ABSTRACT

Titanium and titanium alloy particles are provided with improved mechanical properties through the use of ion implantation. Ions of elements selected from the noble metals and titanium are employed. Ion energies of 50–200 kev and ion densities of at least $10^{14}$ ions/sq. cm. are employed.

1 Claim, 1 Drawing Figure

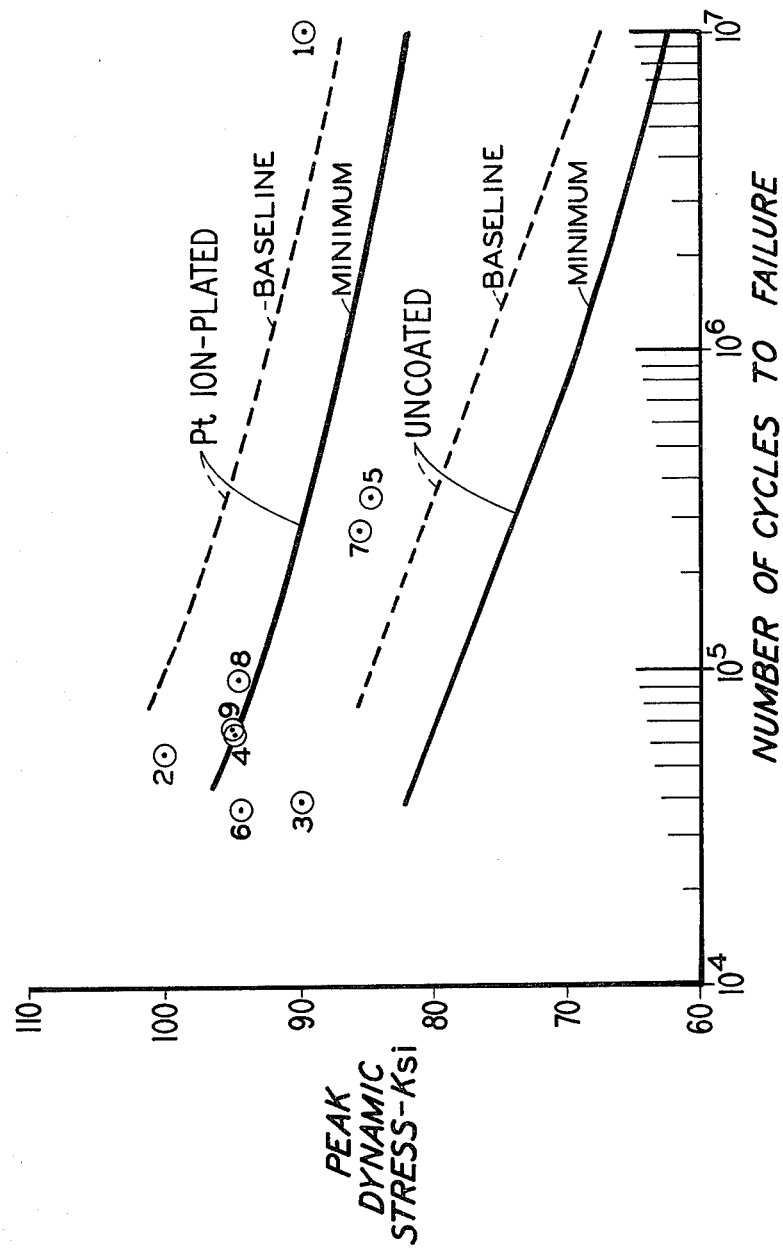

FATIGUE RESISTANT TATANIUM ALLOY ARTICLES

This is a continuation of application Ser. No. 143,963 filed on May 5, 1980, now abandoned.

The Government has rights in this invention pursuant to Contract No. F33615-78-C-5179 awarded by the Deparatment of the Air Force.

TECHNICAL FIELD

This invention is concerned with high temperature fatigue resistant titanium alloy articles and with methods for increasing the high temperature fatigue strength of titanium alloy articles. Titanium alloy articles are provided with improved fatigue strength by the provision of a ion implantation surface treatment.

BACKGROUND OF THE ART

A substantial amount of research and development effort has been directed towards the development and improvement of gas turbine parts and other similar aerospace components.

For certain applications, there exists a need for lightweight materials with good elevated temperature mechanical properties in combination with resistance to oxidation at elevated temperatures. Typical of these applications are compressor blades used in gas turbine engines.

Some of the best materials developed to date for such applications are titanium and the alloys based on titanium. However, the high reactivity of titanium with oxygen at elevated temperatures limits their use.

In "Ion Implantation," 729–738, Vol. 8 (1973) of a series of books published by North-Holland Publishing Company Ltd.—London, G. Dearnaley et al discuss corrosion studies in ion implanted metals. According to the authors, the metal ion species, arranged in order of their effectiveness in inhibiting the thermal oxidation of titanium at 600° C. are as follows: calcium, europium, cerium, yttrium, zinc, aluminum, indium, nickel and bismuth. While implantation of the metal ions disclosed by the authors do apparently provide a degree of protection against oxidation of titanium, mere ion implantation with the particular metal ions disclosed is ineffective in plating titanium or titanium alloy components with an oxidation-resistant protective coating so as to provide improved mechanical properties in gas turbine compressor environments.

U.S. Pat. No. 4,137,370 by Fujishiro et al discloses a process for improving the fatigue properties of titanium alloy through the use of ion plating to provide a noble metal protective layer on the surface of the article.

DISCLOSURE OF THE INVENTION

The present invention includes a titanium alloy article having a thin surface portion which is enriched with the material selected from the group consisting of precious metals and titanium and mixtures thereof. The surface enriched layer is protected by ion implantation using ion energies of between about 50 to 200 kev.

The invention also includes the method for producing the coating in which ions of the above mentioned energies are implanted in the surface of the article with a density in excess of about $10^{15}$ ions/cm$^2$.

BRIEF DESCRIPTION OF THE DRAWING

The drawing shows a plot of applied fatigue stress vs. number of cycles to cause failure at 850° F. of a variety of gas turbine titanium compressor blades for several different surface treatments.

BEST MODE FOR CARRYING OUT THE INVENTION

The present invention relates to the improvement of the high temperature mechanical properties (especially fatigue resistance) in titanium and titanium alloy articles. The articles are given an ion implantation treatment in which ions are selected from the group consisting of the noble metals and titanium. From about $10^{14}$ to about $10^{18}$ ions are implanted per sq. cm at energies between about 50 and about 200 kev.

Nine titanium alloy gas turbine compressor blades were ion implanted with ions under various conditions. The blades were made of an alloy having a nominal composition of 6% aluminum, 2% tin, 4% zirconium, 6% molybdenum, balance titanium.

The details of the ion implantation treatment are given in Table I. Ion implantation energies varied from 50 to 191 kev and the number of ions/sq. cm. ranged from $10^{15}$ to $5 \times 10^{15}$. Most of the implantation was done using apparatus commercially available from the Extrion Corporation of Gloucester, Massachusetts. These blades were fatigue tested at 850° F. with a zero steady state stress and an applied dynamic stress produced by vibrating the blades at a frequency of 610 Hz. The results of the nine treated blades are shown in the figure.

Also shown in the figure are plots for the fatigue properties of the uncoated titanium alloy and for the same titanium alloy having a platinum ion plated coating as described in U.S. Pat. No. 4,137,370.

Two curves are shown, for both coated and uncoated alloys, representing the base line fatigue behavior and the minimum observed fatigue behavior. It can be seen that the use of ion implantation to implant either platinum or titanium in the outer surface of the blades is effective to significantly increase the fatigue strength.

The implantation of high energy ions (150 kev) appears to be more effective than the implantation of low energy ions (50 kev). The 150 kev ions are seen to produce fatigue strength which are comparable to the base line fatigue strength of titanium alloys coated according to U.S. Pat. No. 4,137,370. Ion implantation permits these equivalent fatigue properties to be achieved using substantially less Pt than is required in the case of ion plating.

The low energy ions (50 kev) are seen to be less effective although they still provide improved fatigue properties when compared to the uncoated material.

In samples 6 and 7, titanium ions implanted at 100 kev are seen to provide results comparable to though slightly less than platinum ions implanted under similar conditions. In view of this result, the oxidation resistance of Pt, which U.S. Pat. No. 4,137,370 theorized was responsible for improved fatigue properties, cannot be entirely responsible for the improved properties in this case. We believe, although we do not intend to be limited by this theory, that the improved fatigue properties are due in part to the fact that ion implantation leaves the material surface in a state of residual compressive stress.

There is also some indication that the use of higher energy ions (191 kev) produced less benefit than 100 kev ions, for the same density of applied ions. This might result from the fact that the higher energy ions penetrate more deeply below the surface, and hence are less effective in improving the properties in the article immediately at its outer surface where fatigue damage originates. Based on these results, it is believed that ion implantation energies between 50 and 200 kev will produce the maximum benefit and that ion implantation density in excess of $10^{14}$ ions/sq. cm. and preferably above $10^{15}$ ions/sq. cm. are desired. Ion implantation densities in excess of about $10^{18}$ do not appear to give any added result, hence this is a preferred upper limit.

As used herein, the term "noble metals" includes ruthenium, rhodium, palladium, osmium, iridium, gold and platinum. Pure titanium as an ion implantation species is also a part of this invention. Finally, it is within the scope of the invention to use mixtures of these metals and mixtures of these metals with titanium as the implanting species.

The present invention is particularly applicable to the structural titanium alloys which are well known in the literature which includes titanium, 6% aluminum, 4% vanadium and titanium, 6% aluminum, 2% tin, 4% zirconium and 2% molybdenum. The invention is also applicable to commercially pure titanium.

Ion implantation is the deposition of ions below the surface of a substrate. A wide variety of ions may be implanted although the depth of implantation will usually be less than about 1 micron.

It is important to distinguish between ion implantation and ion plating. In ion plating, a source of metal vapor is provided and a very small fraction of this vapor (less than 1%) is ionized. An electric field is applied between the vapor source and substrate to be coated and serves to partially ionize the metal vapor. The ionized metal vapor is accelerated towards the substrate and coats the structure. The ionized metal vapor penetrates the surface of the substrate to a slight degree. The depth of penetration is proportional to the applied electric field. The non-ionized metal vapor coats the surface by vapor deposition and does not penetrate the surface of the substrate except to the extent that thermal diffusion may occur.

Typically, in ion plating the applied electric field is less than 10 kev. Thus, for example, in U.S. Pat. No. 4,137,370, in column 2, line 68, the range of 2 to 4.5 kev is specified in conjunction with the application of a platinum layer to a titanium substrate by ion plating.

In ion implantation, different conditions are used so as to maximize the amount of vapor atoms which are ionized so as to penetrate the substrate and the depth to which these ions penetrate the substrate. Thus in ion implantation, high applied electric fields are used ranging from about 10 kev up to and including 1 mev. The sources used for ion implantation are also arranged so that a much greater degree of the ionization of the vapor source occurs. The result of these two differences is that virtually all of the ions which strike the surface in an ion implantation technique penetrate below the surface to a significant depth.

Thus, the coatings which result from ion implantation are different from those produced by ion plating. In ion implantation, virtually all of the incident ions penetrate the surface so that there is very little of the incident material which can be detected at the surface. Instead, most of this material is found below the surface at a characteristic depth determined by the ion species implanted and the energy employed in the deposition process.

In contrast in ion plating, very few of the ions penetrate the surface and those that do penetrate only to a very slight depth. Instead most of the incident material remains at the surface as a discrete surface layer of the substrate.

TABLE I

ION-IMPLANTATION PARAMETERS

| Blade No. | Element Ion-Implanted | Energy kev | Fluence (ions/cm$^2$) |
|---|---|---|---|
| 1 | Pt | 150 | $5 \times 10^{15}$ |
| 2 | Pt | 150 | $5 \times 10^{15}$ |
| 3 | Pt | 50 | $5 \times 10^{15}$ |
| 4 | Pt | 50 | $5 \times 10^{15}$ |
| 5 | Pt | 191 | $1 \times 10^{15}$ |
| 6 | Ti | 100 | $1 \times 10^{15}$ |
| 7 | Ti | 100 | $1 \times 10^{15}$ |
| 8 | Pt | 100 | $1 \times 10^{15}$ |
| 9 | Pt | 100 | $1 \times 10^{15}$ |

We claim:

1. A method for increasing the elevated temperature fatigue strength of titanium articles which consists of using ion implantation to implant materials selected from the group consisting of the noble metals and titanium and mixtures thereof into the surface of the article under the following conditions:

an incident ion energy between about 50 and about 200 kev with the total number of implanted ions exceeding about $10^{15}$ ions/sq. cm. of article surface but not exceeding about $10^{18}$ ions/sq. cm.

* * * * *

UNITED STATES PATENT AND TRADEMARK OFFICE
CERTIFICATE OF CORRECTION

PATENT NO.  : 4,433,005
DATED       : February 21, 1984
INVENTOR(S) : BRIAN A. MANTY, THOMAS A. ECKLER & SHIRO FUJISHIRO It is certified that error appears in the above-identified patent and that said Letters Patent is hereby corrected as shown below:

In the Title, "TATANIUM" should read "TITANIUM"

Signed and Sealed this

Twenty-sixth Day of February 1985

[SEAL]

Attest:

DONALD J. QUIGG

*Attesting Officer*  *Acting Commissioner of Patents and Trademarks*